(12) United States Patent
Kuenzler

(10) Patent No.: US 9,035,331 B2
(45) Date of Patent: May 19, 2015

(54) SYSTEM FOR THERMAL CONTROL OF RED LED(S) CHIPS

(71) Applicant: GE Lighting Solutions, LLC, East Cleveland, OH (US)

(72) Inventor: Glenn Howard Kuenzler, Beachwood, OH (US)

(73) Assignee: GE Lighting Solutions, LLC, East Cleveland, OH (US)

( * ) Notice: Subject to any disclaimer, the term of this patent is extended or adjusted under 35 U.S.C. 154(b) by 64 days.

(21) Appl. No.: 13/711,818

(22) Filed: Dec. 12, 2012

(65) Prior Publication Data

US 2014/0159077 A1 Jun. 12, 2014

(51) Int. Cl.
| H01L 29/18 | (2006.01) |
| H01L 33/00 | (2010.01) |
| H01L 27/15 | (2006.01) |
| H05B 33/08 | (2006.01) |
| H05K 1/02 | (2006.01) |
| F21Y 111/00 | (2006.01) |
| F21Y 113/00 | (2006.01) |
| H05K 1/18 | (2006.01) |

(52) U.S. Cl.
CPC ............ *H01L 27/15* (2013.01); *H05B 33/0803* (2013.01); *H05B 33/0872* (2013.01); *H05K 2201/10219* (2013.01); *F21Y 2111/008* (2013.01); *F21Y 2113/005* (2013.01); *H05K 1/0209* (2013.01); *H05K 1/181* (2013.01); *H05K 2201/10106* (2013.01); *H05K 2201/10151* (2013.01); *F21V 29/54* (2015.01)

(58) Field of Classification Search
CPC ..... H01L 25/0753; H01L 33/62; H01L 33/20; H01L 27/153; H01L 27/15; F21K 9/00; H05K 1/0209; H05B 33/0872; H05B 33/0803; F21V 29/407

USPC .............................. 257/59, 72, 79–82, 88, 290
See application file for complete search history.

(56) References Cited

U.S. PATENT DOCUMENTS 7,525,191 B2 * 4/2009 Nakazato et al. ............. 257/713
7,682,048 B2 3/2010 Hsu et al.
(Continued)

FOREIGN PATENT DOCUMENTS

DE 102010012078 A1 9/2011
DE 102011004811 A1 8/2012
(Continued)

OTHER PUBLICATIONS

PCT Search Report and Written Opinion dated Mar. 5, 2014 issued in connection with corresponding PCT Application No. PCT/US2013/070466.

*Primary Examiner* — Michelle Mandala
(74) *Attorney, Agent, or Firm* — GE Global Patent Operation; Peter T. DiMauro

(57) ABSTRACT

A light emitting diode assembly includes a first light emitting diode disposed on a first substrate and a second light emitting diode disposed on a second substrate that is disposed substantially adjacent to the first substrate. The second light emitting diode has a higher rate of performance degradation over time due to temperature than the first light emitting diode. A heat sink is thermally coupled to the first substrate and an electrical cooling circuit is thermally coupled to the second substrate. The electrical cooling circuit is configured to reduce a temperature of the second substrate when the electrical cooling circuit is electrically energized.

22 Claims, 3 Drawing Sheets

(56) References Cited

U.S. PATENT DOCUMENTS

| | | | |
|---|---|---|---|
| 7,838,986 B2* | 11/2010 | Tsao et al. | 257/712 |
| 2004/0189170 A1 | 9/2004 | Aisenbrey | |
| 2007/0102033 A1 | 5/2007 | Petrocy | |
| 2008/0042578 A1 | 2/2008 | Arai et al. | |
| 2009/0079358 A1 | 3/2009 | Shteynberg et al. | |
| 2010/0171935 A1 | 7/2010 | Yamagishi et al. | |

FOREIGN PATENT DOCUMENTS

| | | |
|---|---|---|
| KR | 0947170 B1 | 3/2010 |
| KR | 20120037238 A | 4/2012 |

\* cited by examiner

SYSTEM FOR THERMAL CONTROL OF RED LED(S) CHIPS

BACKGROUND

1. Field of the Invention

The aspects of the present disclosure relate generally to light emitting diode devices and in particular to addressing color shifting of red LEDs in blue shifted yellow and red (BSY-R) light engines.

2. Description of Related Art

Light Emitting Diodes (LED(s)) are widely used in general lighting. An LED is generally understood as a semiconductor device that generates light when electrical energy is applied to the device. LED arrays, in which multiple LEDs are formed into an array and powered as a unit, are gaining popularity in lighting and signaling applications. LED arrays are typically connected to a direct current (DC) power source where the amount of applied current controls the brightness of emitted light.

The level of light that an LED outputs will typically depend upon the amount of electrical current supplied to the LED, also referred to as a diode or chip, and the operating temperature of the LED. Operating temperatures also affect the useful life of an LED. LED light engines that mix phosphor-coated blue dies with red dies tend to encounter problems, in that red dies degrade more quickly because red dies are more sensitive to temperature than blue dies. This degradation will cause the system color to shift away from red over time.

In blue shifted yellow and red light engines, generally referred to as "BSY-R", the blue and red LED chips are typically mounted to a common platform. The common platform is then connected to the main heat sink. As such, all of the LED chips on the platform experience the same thermal environment. Red LED chips are known to have much stronger "droop" curves than blue dies. "Droop" curves illustrate the light output with temperature over time. Thus, a red LED chip will show a faster rate of decline in light output over time at higher temperatures than, for example, a blue LED chip. Generally, BSY-R includes white LEDs plus red LEDs. It will be understood that the white LEDs are blue LEDs with a phosphor that, together, produce white.

Some applications implement a separate control to manage the electrical current to the red LED chips over time to compensate for thermal degradation. This generally results in an increase in electrical current over time. In some cases, extra red LED chips or optical detectors are required to compensate for the thermal degradation of the red LED chips. However, the increase in required current or additional components adds more cost to the light engine system.

An LED can be mounted on a metal heat sink to dissipate the heat when the diode is run using high current. It is desirable to run LEDs using high current because the brightness of the light emitted from the LEDs is more intense at higher currents. However, as the number of LEDs in an array increase, the operating temperatures tend to increase. The higher operating temperatures can negatively impact LEDs which show a faster rate of decline in light output over time at higher temperatures than other LEDs. The light output of such an LED array will have a tendency to shift away from the color of the degrading LED.

A thermoelectric device or cooler (TEC) can be used with LED devices to provide cooling. A thermoelectric cooler is a device that can force one surface to a particular temperature and has been proposed for use with LED lighting to make the LEDs run cooler. This can generally be referred to as a "thermoelectric effect." The thermoelectric effect is generally understood to be the direct conversion of temperature differences to electric voltage, and electric voltage to temperature differences. The thermoelectric effect can be used to generate electricity, measure temperature or change the temperature of objects. An example of a thermoelectric device is one that includes two different materials or dissimilar metals that are in the path of an electric circuit and provides direct conversion of voltages to heat differentials. Such thermoelectric devices, as are generally understood, will provide a temperature differential when an electric voltage difference is applied to the two dissimilar metals. The term "thermoelectric effect" is generally understood to encompass three different effects, the Peltier effect, the Seebeck effect and the Thomson effect. However, the total electrical power that is required to operate a thermoelectric device may be excessive when applied to the entire light engine and can limit its usefulness in lamp applications, as well as the efficiency of such applications.

Accordingly, it would be desirable to provide a light engine that resolves at least some of the problems identified above.

SUMMARY OF THE INVENTION

As described herein, the exemplary embodiments overcome one or more of the above or other disadvantages known in the art.

One aspect of the present disclosure relates to a light emitting diode assembly. In one embodiment, the light emitting diode assembly includes a first light emitting diode disposed on a first substrate and a second light emitting diode disposed on a second substrate. The second substrate is disposed substantially adjacent to the first substrate and the second light emitting diode has a higher rate of performance degradation over time due to temperature than the first light emitting diode. A heat sink is thermally coupled to the first substrate and an electrical cooling circuit is thermally coupled to the second substrate. The electrical cooling circuit is configured to cool the second substrate when the electrical cooling circuit is electrically energized.

Another aspect of the disclosed embodiments is directed to an illumination assembly. In one embodiment, the illumination assembly includes a light emitting diode array with a first light emitting diode and a second light emitting diode. The second light emitting diode has a higher rate of performance degradation over time due to temperature than the first light emitting diode. A thermoelectric cooling device is coupled to the second light emitting diode. A heat sink is thermally coupled to the first light emitting diode and the thermoelectric cooling device. A controller is electrically coupled to the thermoelectric cooling device and configured to regulate a cooling capability of the thermoelectric device based on a detected temperature of the second light emitting diode, and maintain an operating temperature of the second light emitting diode at a temperature that is less than an operating temperature of the first light emitting diode.

These and other aspects and advantages of the exemplary embodiments will become apparent from the following detailed description considered in conjunction with the accompanying drawings. It is to be understood, however, that the drawings are designed solely for purposes of illustration and not as a definition of the limits of the invention, for which reference should be made to the appended claims. Additional aspects and advantages of the invention will be set forth in the description that follows, and in part will be obvious from the description, or may be learned by practice of the invention. Moreover, the aspects and advantages of the invention may be realized and obtained by means of the instrumentalities and combinations particularly pointed out in the appended claims.

DETAILED DESCRIPTION OF THE DISCLOSED EMBODIMENTS

Figure 1:
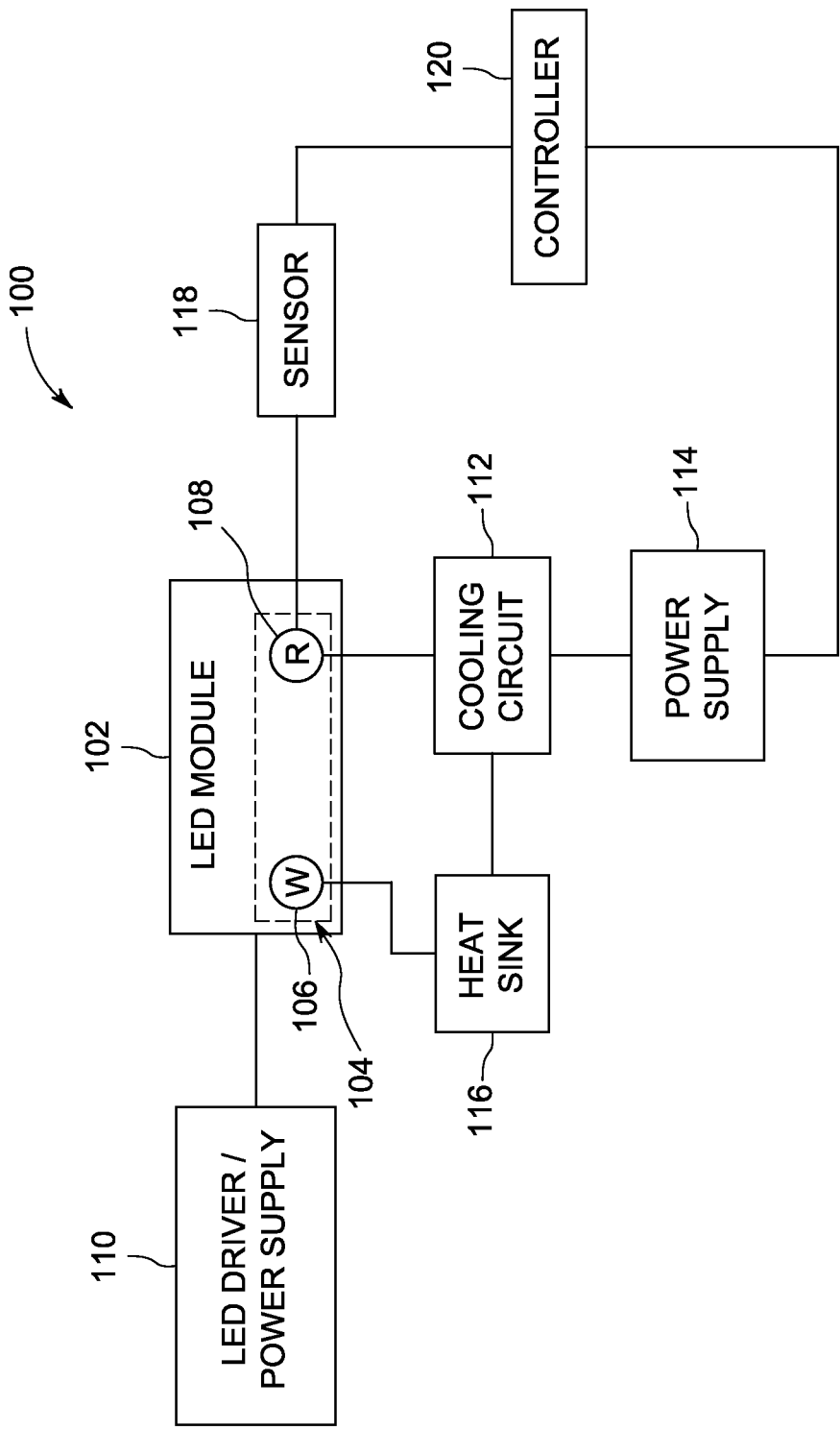
FIG. 1 illustrates a block diagram of an exemplary light emitting diode assembly incorporating aspects of the present disclosure.

Referring to FIG. 1, one embodiment of an LED assembly incorporating aspects of the disclosed embodiments is generally indicated by reference number 100. The aspects of the disclosed embodiments are directed to providing selective cooling to one or more LEDs in the LED assembly 100, the selective cooling being applied to those LEDs in the LED assembly that exhibit a greater rate of performance degradation over time due to temperature relative to other LEDs in the LED assembly 100. In this manner, the performance degradation of these LEDs over time due to temperature is diminished relative to the other LEDs in the LED assembly 100, and the temperature impact on the color output of the LED assembly 100 is minimized.

The LED assembly 100 illustrated in FIG. 1 includes an LED module 102 that has at least one LED 104. For the purposes of the description herein, only one LED will generally be referred to. However, it will be understood that more than one LED can be included, as can be one or more LED arrays. The LED 104 can include one or more first LEDs 106 and one or more second LEDs 108. The first LEDs 108, such as for example red LEDs, will have a higher rate of performance degradation over time due to temperature than the second LEDs 106, such as for example, white LEDs. As noted herein, red LEDs are generally known to have a higher rate of performance degradation over time due to temperature than white LEDs, meaning that the light output of the red LEDS will decrease faster over time due to temperature than white LEDs. Although the aspects of the disclosed embodiments will be described herein with respect to white and red LEDs, the aspects of the disclosed embodiments can also include cooling chips directed to other LED colors, including for example, amber, yellow and green LED chips.

In the embodiment shown in FIG. 1, the LED module 102 is electrically coupled to an LED driver module or power supply 110. The driver module 110 directs a power signal to the LED module 102 to power the LED module 102 and the LED 104. An LED thermal regulation system, or cooling circuit 112, is thermally coupled to the LED module 102. In the example of FIG. 1, the LED cooling circuit 112 is powered by a power supply or controller 114. Although a separate power supply 114 for the cooling system 112 is shown in FIG. 1, in one embodiment, the LED cooling system 112 can be powered by the driver module 110 via the LED module 102. The LED assembly 100 can also include a heat sink 116 that is used to cool the LED module 102. In one embodiment, one or more sensors 118 can be used to monitor the temperature of one or more of the red LED(s) 108 and white LED(s) 106. The sensors 118 can comprise any suitable temperature measurement device, such as a resistive type device, a thermistor, bimetallic device or thermocouple, for example.

The sensor 118 can be coupled to a controller 120 or other suitable feedback circuit, which in turn can control the cooling circuit 112 to maintain the red LED(s) 108 at a predetermined operating temperature, or within a pre-determined temperature range. In one embodiment, the sensor 118 and feedback controller 120 shown in FIG. 1, also referred to herein as or a feedback control circuit or module, can be used to control the temperature reduction, or cooling effect, provided by the cooling circuit 112. In this example, the feedback controller 120 can provide a temperature regulation signal to the power supply 114, or LED driver 102, which provides an electrical signal to the cooling circuit 112 that will control the cooling circuit 112 to maintain the temperature of the red LED(s) 108 at the desired level.

Because LED chip forward voltage is sensitive to temperature in a way that can be described in a formula or table, in one embodiment the feedback controller 120 may instead monitor the forward voltage of the red LED(s) 108 as a measure of operating temperature, in order to determine the appropriate level of cooling for the red LED(s) 108 to maintain the desired voltage and temperature output. For example, by knowing both the forward voltage of the red LED(s) 108 and the current applied to the red LED(s) 108, the exact power consumption can be calculated and a corresponding power to the cooling circuit 112 can be applied based on a formula or a lookup table. The applied power to the cooling circuit 112 may also be determined by a simple formula or lookup table based only on the applied current (an input variable, rather than a measured response), where that formula or table has been predetermined based on an analysis of the system behavior with a given heat sink 116. The feedback controller 120 can comprise any suitable control device, such as for example, a proportional-integral-derivative (PID) controller, a proportional-integral (PI) controller, or other suitable feedback control mechanism. In one embodiment, the controller 120 can be comprised of machine-readable instructions that are executable by a processing device, such as a microprocessor.

During operation, the LED 104 generates heat that can affect the performance of the LED module 102. In particular, the performance of the red LED(s) 108 can be degraded over time due to temperature at a rate that is generally faster than the white LED(s) 106. This can cause the color output of the LED module 102 to shift. The aspects of the disclosed embodiments are directed to separately controlling and maintaining the temperature of the red LED(s) 108 at a lower temperature in order to minimize heat or temperature degradation of those components, which then balances their behavior with respect to the white LED(s) 106 and provides consistent color performance over time.

In one embodiment, the cooling circuit 112 comprises a thermoelectric device or module that can be used to selectively cool the red LED(s) 108. In alternate embodiments, the cooling circuit 112 can comprise any suitable cooling device that can force one surface to a particular desired temperature or temperature difference with respect to another location. The cooling circuit 112 of the disclosed embodiments is configured to selectively cool only the red LED(s) 108, forcing their temperature low enough so that the performance degradation due to temperature does not impact the color outputted by the LED module 102. The lower temperature selected for the red LED(s) 108 will force the degradation curve of the red LED(s) 108 to match the degradation curve of the white LED(s) 106, which are at a higher temperature, and minimize the color shifting problems associated with BSY-R technology. The aspects of the disclosed embodiments advantageously and effectively implement the high-efficiency performance of the BSY-R LED technology.

Figure 2:
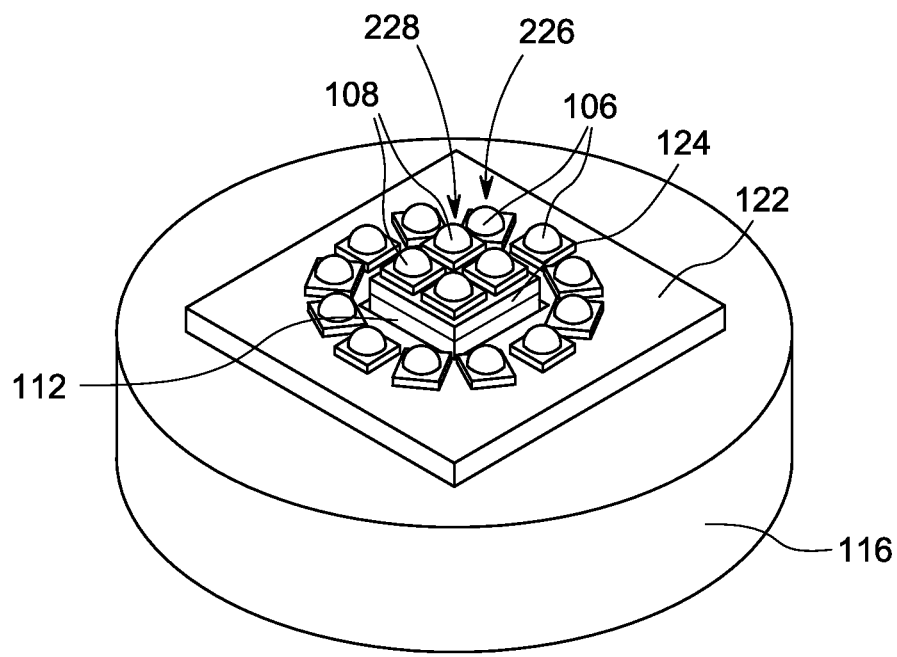
FIG. 2 illustrates a perspective view of one embodiment of the exemplary light emitting diode assembly incorporating aspects of the present disclosure.

FIG. 2 illustrates one embodiment of an LED assembly 100, also referred to as an illumination assembly, incorporating aspects of the present disclosure. In this example, the LED module 102 includes an array 226 of white LEDs 106 and an array 228 of red LEDs 108. The array 226 of white LEDs 106 is disposed on a main LED substrate or board 122. The array 228 of red LEDs 108 is disposed on a sub-LED substrate or board 124. In this example, the sub-LED board 124 is positioned in near proximity or substantially adjacent to the main LED board 122. In alternate embodiments, the main LED board 122 and the sub-LED board 124 can be disposed in any suitable positional relationship that allows the sub-LED board 124 to be selectively cooled relative to the main LED board 122, while still providing the desired optical and lighting effect. Although the aspects of the disclosed embodiments will be generally described herein with respect to the cooling of the sub-LED board 124, in alternate embodiments, the main LED board 122 could be selectively cooled. The term "substrate" as is used herein generally refers to a material(s) upon which circuits, circuit elements, connections, LEDs and other electrical components can be disposed. In one embodiment, the substrate comprises a ceramic substrate or printed circuit board.

Figure 3:
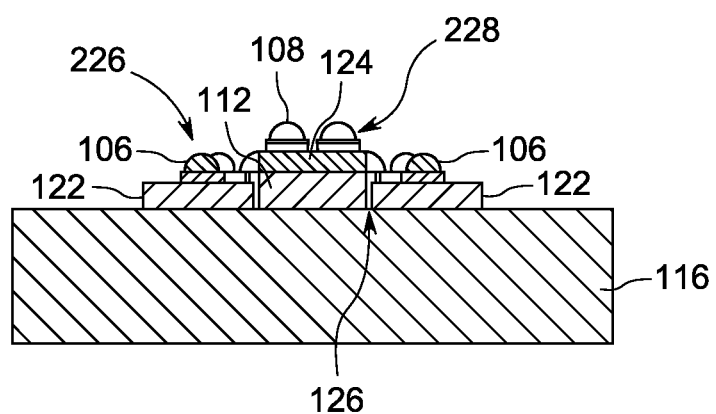
FIG. 3 illustrates a cross-sectional view of the exemplary light emitting diode assembly of FIG. 2.

In the embodiment shown in FIG. 2, the sub-LED board 124 is thermally coupled to the cooling circuit 112. The cooling circuit 112 is thermally coupled to the heat sink 116. The heat sink 116 dissipates the heat that the cooling circuit 112 draws from the sub-LED board 124. The cooling circuit 112 is thermally coupled to the heat sink 116 either directly or through the main LED board 122. In one embodiment, the main LED board 122 can include an opening 126, shown in FIG. 3, which allows the cooling circuit 112 to be disposed in thermal contact with the heat sink 116. Alternatively, the cooling circuit 112 can be disposed on, or be part of, the main LED board 122, which in turn is thermally coupled to the heat sink 116. The heat sink 116 can be made of any suitable material, such as aluminum or metal, which has a relatively high thermal conductivity.

In the example of FIG. 2, the cooling circuit 112 comprises a Peltier thermoelectric cooling device or module. In one embodiment, the cooling circuit 112 is powered by the power control 114 shown in FIG. 1 and is used to force the surface of the sub-LED board 122 and the array 228 of red LED(s) 108 to a desired temperature or temperature range, such as approximately 25° degrees Celsius, for example. In an alternate embodiment, the cooling circuit 112 can be powered by the LED driver power supply 110 and LED control module 102.

As shown in FIG. 2, the cooling circuit 112, the Peltier thermo-electric cooling device in this example, is attached to one side (or face) of the sub-LED board 124, with the red LEDs 108 on the other side. The sub-LED board 124 is configured to generally exhibit a low thermal resistance to provide sufficient transmission of heat or thermal conductivity. The cooling effect of the cooling circuit 112 reaches the red LED(s) 108 and efficiently reduces the temperature of, or cools, the red LED(s) 108.

In the embodiments shown in FIGS. 1 and 2, the cooling circuit 112 is sandwiched between the sub-LED board 124 and the heat sink 116 such that the cooling circuit 112 is adjacent to, and in thermal contact with each of the sub-LED board 124 and the heat sink 116. The heat sink 116 is used to provide cooling to the main LED board 122 and the white LED(s) 106. The heat sink 116 can also be thermally coupled to the sub-LED board 124 to provide additional cooling for the cooling circuit 112. In this manner, the temperature of the red LED(s) 108 can be selectively reduced, or cooled, to a desired temperature, which will generally be a lower temperature relative to a temperature of the white LED(s) 106 and main LED board 122.

In the embodiment shown in FIG. 2, the array 228 of red LEDs 108 is arranged in a substantially square shape, with the array 226 of white LEDs 106 surrounding array 228 of the red LEDs 108 in a substantially circular shape or fashion. In alternate embodiments, the white and red LEDs 106, 108 can be arranged in any suitable arrangement or fashion that allows the temperature of the red LEDs 108 to be selectively managed and reduced by the cooling circuit 112. The arrangement of the LEDs 106, 108 is based on a function of the desired optical performance. For example, the white and red LEDs 106, 108 could be arranged in two rows, or in side-by-side clusters, or any other pattern provided that cooling circuit 112 can be suitably incorporated and that the external optics can produce the desired output light pattern.

The cooling circuit 112, while shown in FIG. 2, as sandwiched between the sub-LED board 124 and the heat sink 116, can also be formed as a separate structure. In this embodiment, the cooling circuit 112 can be separately formed as a standalone structure, thermally coupled to the sub-LED board 124 and a separate heat sink (not shown) other than heat sink 116.

Figure 4:
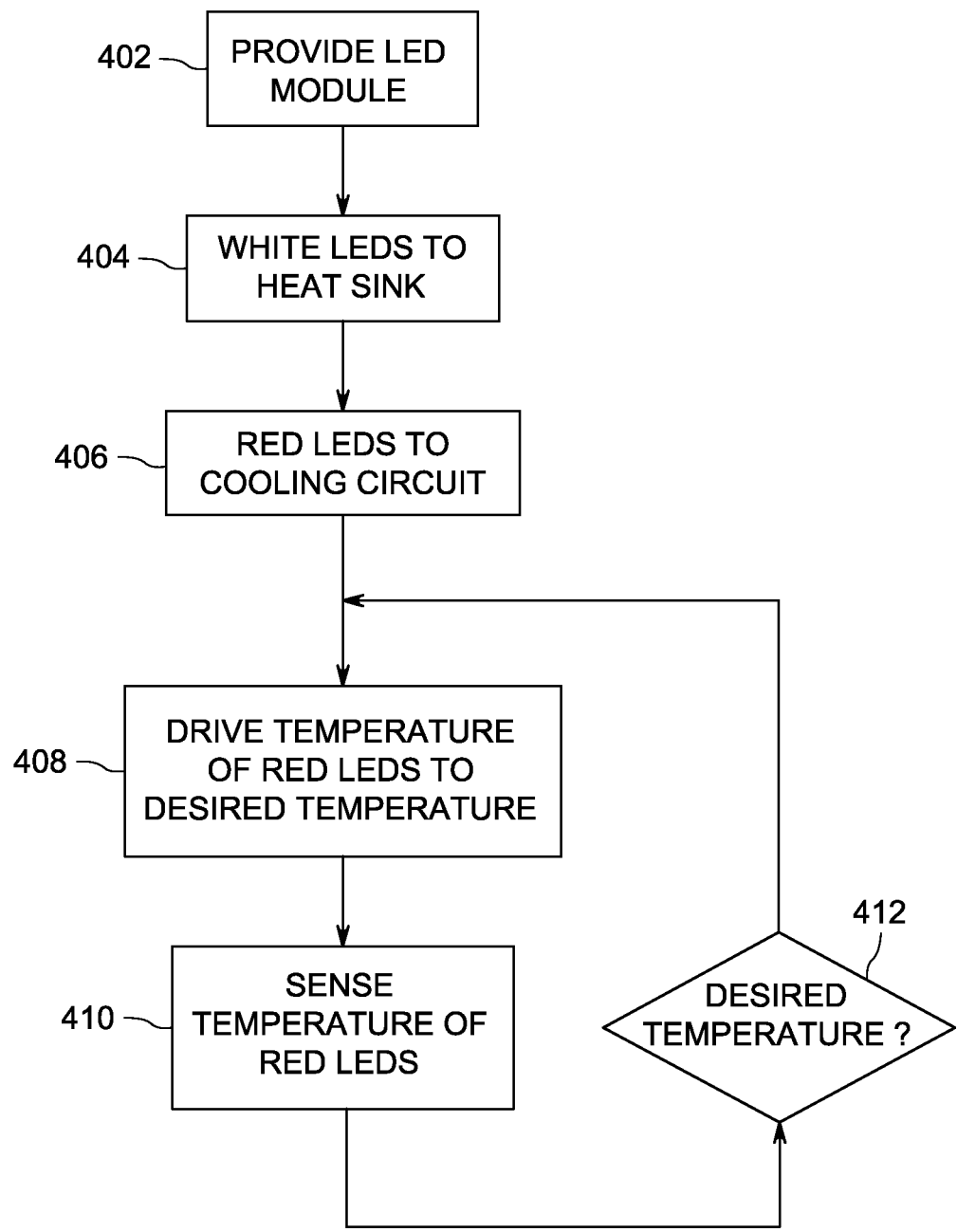
FIG. 4 is a flowchart illustrating one embodiment of a process flow incorporating aspects of the present disclosure.

FIG. 4 illustrates one embodiment of a process incorporating aspects of the disclosed embodiments. In one embodiment, an LED module 102 is provided 402 that includes both white LED(s) 106 and red LED(s) 108. The white LED(s) 106 are grouped together, and the red LED(s) 108 are grouped together, each group separated from one another. The aspects of the disclosed embodiments also contemplate different or multiple groups of white and red LEDs 106, 108, disposed in the LED module 102. The white LED(s) 106 are disposed 404 in thermal contact with a heat sink 116, while the red LED(s) 108 are thermally coupled 406 to a cooling circuit 112, such as a thermoelectric device. As noted herein, in one embodiment, the cooling circuit 112 must also be in thermal communication with the heat sink 116 or with a separate heat sink not shown.

In one embodiment, a controller 120 or other suitable feedback control, is used to drive or maintain 408 a temperature of the red LED(s) 108 at a pre-determined temperature or range, such as approximately 25° C. The controller 120 is configured to regulate the temperature of the red LED(s) independently of the temperature of the white LED(s) 106. In the embodiment where the cooling circuit 112 comprises a Peltier thermoelectric cooling device, the controller 120 is configured to control the current delivered to the Peltier thermoelectric cooling device, which then causes the Peltier thermoelectric cooling device to create a temperature difference and provide a cooling effect.

In one embodiment, the sensor 118 can be used to sense or monitor 410 the temperature of the sub-level board 124 or red LED(s) 108. A determination 412 is made as to whether the red LED(s) 108 is at the desired temperature or range. The temperature signal or feedback is used to regulate the heat extraction capability of the cooling circuit 112 to drive or maintain 408 the temperature of the red LED(s) 108 at the desired temperature or range.

The aspects of the disclosed embodiments provide a separate cooling system for the red LEDs in an LED assembly. This can eliminate the need for separate or complex controls to change the current delivered to the red LED chips over time in order to compensate for the thermal degradation that occurs relative to white LED(s). The aspects of the disclosed embodiments can provide more color consistency over the life of the LED assembly, with less cost and hardware complexity.

Thus, while there have been shown, described and pointed out, fundamental novel features of the invention as applied to the exemplary embodiments thereof, it will be understood that various omissions and substitutions and changes in the form and details of devices and methods illustrated, and in their operation, may be made by those skilled in the art without departing from the spirit and scope of the invention. Moreover, it is expressly intended that all combinations of those elements and/or method steps, which perform substantially the same function in substantially the same way to achieve the same results, are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A light emitting diode assembly, comprising:
a first substrate and a second substrate;
a heat sink thermally coupled to the first substrate and the second substrate;
a first light emitting diode disposed on the first substrate;
a second light emitting diode disposed on the second substrate, the second substrate being disposed substantially adjacent to the first substrate, the second light emitting diode have a higher rate of performance degradation over time due to temperature than the first light emitting diode;
an electrical cooling circuit thermally coupled to the second substrate and the heat sink, the electrical cooling circuit being configured to reduce a temperature of the second substrate when the electrical cooling circuit is electrically energized.

2. The light emitting diode assembly of claim 1, comprising:
a controller coupled to the electrical cooling circuit, the controller configured to regulate a heat extraction capability of the electrical cooling circuit.

3. The light emitting diode assembly of claim 2, comprising:
a sensor coupled to the second substrate and the controller, and configured to detect the temperature of the second substrate and provide a temperature signal to the controller.

4. The light emitting diode assembly of claim 1, wherein the electrical cooling circuit comprises a thermoelectric device.

5. The light emitting diode assembly of claim 4, wherein the thermoelectric device comprises a Peltier thermoelectric device.

6. The light emitting device of claim 1, wherein the electrical cooling circuit is configured to control the temperature of the second light emitting diode independently of the first light emitting diode.

7. The light emitting device of claim 1, wherein the first light emitting diode on the first substrate is disposed adjacent to the second light emitting diode on the second substrate.

8. The light emitting device of claim 1, wherein each of the first light emitting diode and the second light emitting diode comprise a light emitting diode array.

9. The light emitting device of claim 1, wherein the electrical cooling circuit is configured to reduce the temperature of the second substrate to a temperature at which a performance degradation curve of the second light emitting diode will substantially match a performance degradation curve of the first light emitting diode at a higher temperature.

10. The light emitting device of claim 1, wherein the first light emitting diode is a white light emitting diode and the second light emitting diode is a red light emitting diode.

11. An illumination assembly, comprising:
a light emitting diode array arranged on a common heat dissipation platform, the light emitting diode array including a first light emitting diode and a second light emitting diode, the second light emitting diode have a higher rate of performance degradation over time due to temperature than the first light emitting diode;
wherein the common heat dissipation platform comprises:
a thermoelectric cooling device coupled to the second light emitting diode;
a heat sink thermally coupled to the first light emitting diode and the thermoelectric cooling device; and
a controller electrically coupled to the thermoelectric cooling device and configured to regulate a cooling capability of the thermoelectric cooling device based on a detected operating temperature of the second light emitting diode and maintain an operating temperature of the second light emitting diode at a temperature that is less than an operating temperature of the first light emitting diode.

12. The illumination assembly of claim 11, wherein the thermoelectric cooling device comprises a Peltier thermoelectric device.

13. The illumination assembly of claim 11, wherein the controller is configured to regulate the thermoelectric device independently of the operating temperature of the first light emitting diode.

14. The illumination assembly of claim 11, comprising:
a first substrate on which the first light emitting diode is disposed; and
a second substrate, adjacent to the first substrate, on which the second light emitting diode is disposed.

15. The illumination assembly of claim 14, wherein the first substrate is physically separated from the second substrate.

16. The illumination assembly of claim 14, wherein one side of the first substrate is thermally coupled to the heat sink, one side of the second substrate is coupled to the heat sink, and a second side of the second substrate is thermally coupled to the thermoelectric device.

17. The illumination assembly of claim 11, wherein the thermoelectric cooling device is configured to reduce the operating temperature of the second light emitting diode to an operating temperature at which a performance degradation curve of the second light emitting diode substantially matches a performance degradation curve of the first light emitting diode at a higher operating temperature.

18. The illumination assembly of claim 11, wherein the controller is configured to:
determine a power consumption of the second light emitting diode; and
determine a power to be applied to the thermoelectric cooling device to maintain the operating temperature of the second light emitting diode based on the power consumption of the second light emitting diode.

19. The illumination assembly of claim 11, wherein the first light emitting diode is a white light emitting diode and the second light emitting diode is a red light emitting diode.

20. The light emitting device of claim 1, wherein the first substrate includes an opening and the second substrate is disposed within the opening.

21. The light emitting device of claim 1, wherein the first substrate is concentrically arranged around the second substrate.

22. A light emitting diode assembly, comprising:
a heat dissipation platform;
a first substrate disposed on the heat dissipation platform;
a second substrate disposed on the heat dissipation platform;
an array of white LEDs disposed on the first substrate;
an array of red LEDs disposed on the second substrate; and
wherein the heat dissipation platform comprises:
a heat sink and a cooling circuit, the first substrate and the second substrate being thermally coupled to the heat sink and the cooling circuit thermally coupling the second substrate and the heat sink; and
wherein the first substrate includes an opening, the cooling circuit being disposed within the opening.

* * * * *